(12) United States Patent
Steuer et al.

(10) Patent No.: US 11,209,480 B2
(45) Date of Patent: Dec. 28, 2021

(54) NON-CONTACT DC VOLTAGE MEASUREMENT DEVICE WITH OSCILLATING SENSOR

(71) Applicant: Fluke Corporation, Everett, WA (US)

(72) Inventors: Ronald Steuer, Hinterbruhl (AT); Ricardo Rodriguez, Mill Creek, WA (US)

(73) Assignee: Fluke Corporation, Everett, WA (US)

( * ) Notice: Subject to any disclaimer, the term of this patent is extended or adjusted under 35 U.S.C. 154(b) by 0 days.

(21) Appl. No.: 17/018,931

(22) Filed: Sep. 11, 2020

(65) Prior Publication Data

US 2020/0408836 A1 Dec. 31, 2020

Related U.S. Application Data

(63) Continuation of application No. 15/977,662, filed on May 11, 2018, now Pat. No. 10,802,072.

(51) Int. Cl.
*G01R 31/302* (2006.01)
*G01R 31/28* (2006.01)

(52) U.S. Cl.
CPC ....... *G01R 31/302* (2013.01); *G01R 31/2879* (2013.01)

(58) Field of Classification Search
None
See application file for complete search history.

(56) References Cited

U.S. PATENT DOCUMENTS 5,473,244 A 12/1995 Libove et al.
5,583,444 A 12/1996 Nakamura et al.
(Continued)

FOREIGN PATENT DOCUMENTS

CN 2639905 Y 9/2004
EP 1 249 706 B1 9/2007
(Continued)

OTHER PUBLICATIONS

Calmet Ltd., "Multifunction Calibrator of alternating and direct voltage current," downloaded on Feb. 7, 2018 from http://www.calmet.com.pl/images/pdf/C101F%20data%20sheet.pdf, 2012, 2 pages.
(Continued)

*Primary Examiner* — Jermele M Hollington
*Assistant Examiner* — Suresh K Rajaputra
(74) *Attorney, Agent, or Firm* — Seed Intellectual Property Law Group LLP

(57) ABSTRACT

Systems and methods for measuring DC voltage of an insulated conductor (e.g., insulated wire) are provided, without requiring a galvanic connection between the conductor and a test electrode or probe. A non-contact DC voltage measurement device may include a conductive sensor that is mechanically oscillated. The device may also include a conductive internal ground guard that is galvanically isolated from the conductive sensor, and a conductive reference shield that is galvanically insulated from the internal ground guard. The device may further include a common mode reference voltage source that generates an alternating current (AC) reference voltage, and a sensor signal measurement subsystem electrically coupled to the conductive sensor. Control circuitry may receive a sensor current signal from the sensor signal measurement subsystem, and determine the DC voltage in the insulated conductor based at least in part on the received sensor current signal.

23 Claims, 5 Drawing Sheets

(56) References Cited

U.S. PATENT DOCUMENTS

| | | | |
|---|---|---|---|
| 5,973,501 | A | 10/1999 | Reichard |
| 6,014,027 | A | 1/2000 | Reichard |
| 6,043,640 | A | 3/2000 | Lauby et al. |
| 6,118,270 | A | 9/2000 | Singer et al. |
| 6,452,398 | B1 | 9/2002 | Libove et al. |
| 6,644,636 | B1 | 11/2003 | Ryan |
| 6,664,708 | B2 | 12/2003 | Schlimak et al. |
| 6,812,685 | B2 | 11/2004 | Steber et al. |
| 6,825,649 | B2 | 11/2004 | Nakano |
| 7,084,643 | B2 | 8/2006 | Howard et al. |
| 7,466,145 | B2 | 12/2008 | Yanagisawa |
| 8,054,061 | B2 | 11/2011 | Prance et al. |
| 8,222,886 | B2 | 7/2012 | Yanagisawa |
| 8,680,845 | B2 | 3/2014 | Carpenter et al. |
| 8,803,506 | B2 | 8/2014 | Yanagisawa |
| 9,063,184 | B2 | 6/2015 | Carpenter et al. |
| 9,201,100 | B2 | 12/2015 | Yanagisawa |
| 10,802,072 | B2 * | 10/2020 | Steuer .................... G01R 15/14 |
| 2002/0167303 | A1 | 11/2002 | Nakano |
| 2004/0075442 | A1 | 4/2004 | Iannello et al. |
| 2007/0086130 | A1 | 4/2007 | Sorensen |
| 2009/0058398 | A1 | 3/2009 | Ibuki |
| 2010/0060300 | A1 | 3/2010 | Müller et al. |
| 2010/0090682 | A1 | 4/2010 | Armstrong |
| 2010/0283539 | A1 | 11/2010 | Yanagisawa |
| 2012/0200291 | A1 | 8/2012 | Carpenter et al. |
| 2012/0259565 | A1 | 10/2012 | Oshima et al. |
| 2012/0290240 | A1 | 11/2012 | Fukui |
| 2013/0076343 | A1 | 3/2013 | Carpenter et al. |
| 2013/0124136 | A1 | 5/2013 | Neeley et al. |
| 2013/0147464 | A1 | 6/2013 | Tan |
| 2014/0035607 | A1 | 2/2014 | Heydron et al. |
| 2014/0062459 | A1 | 3/2014 | El-Essawy et al. |
| 2015/0042320 | A1 | 2/2015 | Cadugan et al. |
| 2016/0047846 | A1 | 2/2016 | Sharma et al. |
| 2016/0080667 | A1 | 3/2016 | Stuart et al. |
| 2016/0109486 | A1 | 4/2016 | Yanagisawa |
| 2016/0119592 | A1 | 4/2016 | Stuart et al. |
| 2017/0082664 | A1 * | 3/2017 | Yamada ............... G01R 19/155 |

FOREIGN PATENT DOCUMENTS

| | | | |
|---|---|---|---|
| JP | 9-184866 | A | 7/1997 |
| JP | 2006-242855 | A | 9/2006 |
| JP | 2007-163414 | A | 6/2007 |
| JP | 2007-163415 | A | 6/2007 |
| JP | 2007-212204 | A | 8/2007 |
| JP | 2007-256141 | A | 10/2007 |
| JP | 2008-2925 | A | 1/2008 |
| JP | 2008-14644 | A | 1/2008 |
| JP | 2008-14645 | A | 1/2008 |
| JP | 2008-20270 | A | 1/2008 |
| JP | 2008-261646 | A | 10/2008 |
| JP | 2008-261783 | A | 10/2008 |
| JP | 2008-261785 | A | 10/2008 |
| JP | 2009-168696 | A | 7/2009 |
| JP | 2010-25778 | A | 2/2010 |
| JP | 2010-286347 | A | 12/2010 |
| JP | 2011-122860 | A | 6/2011 |
| JP | 2012-47677 | A | 3/2012 |
| JP | 2014-44168 | A | 3/2014 |
| JP | 2014-44169 | A | 3/2014 |
| JP | 2016-3997 | A | 1/2016 |
| WO | 99/41616 | A2 | 8/1999 |

OTHER PUBLICATIONS

European Search Report dated Sep. 26, 2019, for European Application No. 19173634.7, 8 pages.

Fluke Corporation, "The 5700A/5720A Series II High Performance Multifunction Calibrators Extended Specifications," downloaded on Feb. 7, 2018 from http://download.flukecal.com/pub/literature/1268275Gw.pdf, 2012, 27 pages.

Fluke Corporation, "Clamp Meter Service Information," downloaded on Feb. 7, 2018 from http://www.industrialcalibration.co.uk/downloads/Fluke%2030%20Clamp%20Meter%20Service%20Date.pdf, 1998, 4 pages.

Galliana et al., "Traceable Technique to Calibrate Clamp Meters in AC Current From 100 to 1500 A," IEEE Transactions on Instrumentation and Measurement 61(9):2512-2518, 2012.

Hioki, "3258: Safety HiTESTER," Revised Edition 5, Hioki E. E. Corporation, Nagano Japan, 2 pages.

Huber et al., "Non-Contact Voltage Measurement Systems," U.S. Appl. No. 62/421,124, filed Nov. 11, 2016, 122 pages.

Mitchell Instrument Company Inc., clipping from the Mitchell Catalogue, undated, 1 page.

Neeley et al., "Maintenance Management Systems and Methods," U.S. Appl. No. 61/514,842, filed Aug. 3, 2011, 22 pages.

Ringsrud et al., "Non-Contact Voltage Measurement System," U.S. Appl. No. 15/345,256, filed Nov. 7, 2016, 39 pages.

Rodriguez et al., "Non-Contact Current Measurement System," U.S. Appl. No. 15/604,320, filed May 24, 2017, 66 pages.

Steuer et al., "Non-Contact Electrical Parameter Measurement Systems," U.S. Appl. No. 15/625,745, filed Jun. 16, 2017, 130 pages.

Steuer et al., "Non-Contact Voltage Measurement System Using Multiple Capacitors," U.S. Appl. No. 15/412,891, filed Jan. 23, 2017, 35 pages.

Steuer et al., "Non-Contact Voltage Measurement System Using Reference Signal," U.S. Appl. No. 15/413,025, filed Jan. 23, 2017, 49 pages.

Stuart et al., "Combined Use of Digital Multimeter and Infrared Camera To Analyze and Diagnose Issues With Voltage Drop and Impedance, Signal," U.S. Appl. No. 62/051,930, filed Sep. 17, 2014, 3 pages.

Stuart et al., "Imaging System Employing Fixed, Modular Mobile, and Portable Infrared Cameras With Ability To Receive, Communicate, and Display Data and Images With Proximity Detection," U.S. Appl. No. 62/068,392, filed Oct. 24, 2014, 9 pages.

Stuart et al., "Infrared Cameras Used as a Method To Trigger Operation and/or Recording of Test and Measurement Devices," U.S. Appl. No. 62/076,088, filed Nov. 6, 2014, 14 pages.

Takahashi, "Clamp On Power Logger PW3365: Safety Voltage Sensor PW9020," Hioki Technical Notes 1(1): 2015, 8 pages.

Tsang et al., "Dual capacitive sensors for non-contact AC voltage measurement," Sensors and Actuators A 167:261-266, 2011.

\* cited by examiner

NON-CONTACT DC VOLTAGE MEASUREMENT DEVICE WITH OSCILLATING SENSOR

BACKGROUND

Technical Field

The present disclosure generally relates to measurement of electrical characteristics, and more particularly, to non-contact measurement of direct current (DC) voltage.

Description of the Related Art

Voltmeters are instruments used for measuring voltage in an electric circuit. Instruments which measure more than one electrical characteristic are referred to as multimeters or digital multimeters (DMMs), and operate to measure a number of parameters generally needed for service, troubleshooting, and maintenance applications. Such parameters typically include alternating current (AC) voltage and current, direct current (DC) voltage and current, and resistance or continuity. Other parameters, such as power characteristics, frequency, capacitance, and temperature, may also be measured to meet the requirements of the particular application.

With conventional voltmeters or multimeters which measure DC voltage, it is necessary to bring at least one measurement electrode or probe into galvanic contact with a conductor, which often requires cutting away part of the insulation of an insulated electrical wire, or providing a terminal for measurement in advance. Besides requiring an exposed wire or terminal for galvanic contact, the step of touching voltmeter probes to stripped wires or terminals can be relatively dangerous due to the risks of shock or electrocution.

Thus, there is a need for a DC voltage measurement device which provides convenient and accurate voltage measurements without requiring galvanic contact with the circuit being tested.

BRIEF SUMMARY

A device to measure direct current (DC) voltage in an insulated conductor may be summarized as including a housing; a conductive sensor physically coupled to the housing, the conductive sensor selectively positionable proximate the insulated conductor without galvanically contacting the insulated conductor, wherein the conductive sensor capacitively couples with the insulated conductor; a conductive internal ground guard which at least partially surrounds the conductive sensor and is galvanically isolated from the conductive sensor, the internal ground guard sized and dimensioned to shield the conductive sensor from stray currents; a conductive reference shield which surrounds at least a portion of the housing and is galvanically insulated from the internal ground guard, the conductive reference shield sized and dimensioned to reduce currents between the internal ground guard and an external ground; a mechanical oscillator operatively coupled to the conductive sensor, in operation, the mechanical oscillator causes the conductive sensor to mechanically oscillate according to a mechanical oscillation amplitude and a mechanical oscillation frequency such that a distance between the conductive sensor and the insulated conductor varies periodically according to the mechanical oscillation amplitude and the mechanical oscillation frequency; a common mode reference voltage source which, in operation, generates an alternating current (AC) reference voltage having a reference frequency, the common mode reference voltage source electrically coupled between the internal ground guard and the conductive reference shield; a sensor signal measurement subsystem electrically coupled to the conductive sensor, wherein the sensor signal measurement subsystem, in operation, generates a sensor current signal indicative of current conducted through the conductive sensor; and control circuitry communicatively coupled to the sensor signal measurement subsystem, wherein, in operation, the control circuitry: receives the sensor current signal from the sensor signal measurement subsystem; and determines the DC voltage in the insulated conductor based at least in part on the received sensor current signal. The control circuitry may determine the DC voltage in the insulated conductor based at least in part on the received sensor current signal, the mechanical oscillation frequency, the AC reference voltage, and the reference frequency. The mechanical oscillator may include a piezoelectric effect mechanical oscillator. The mechanical oscillator may include a microelectromechanical (MEMS) mechanical oscillator.

The control circuitry may, in operation, convert the received sensor current signal to a digital signal; and process the digital signal to obtain a frequency domain representation of the sensor current signal. The control circuitry may implement a fast Fourier transform (FFT) to obtain the frequency domain representation of the sensor current signal. The common mode reference voltage source may generate the AC reference voltage in phase with a window of the FFT implemented by the control circuitry. The control circuitry may include at least one electronic filter which filters the received sensor current signal. The control circuitry may process the sensor current signal to determine an insulated conductor current component and a reference current component, the insulated conductor current component indicative of the current conducted through the conductive sensor due to the voltage in the insulated conductor, and the reference current component indicative of the current conducted through the conductive sensor due to the voltage of the common mode reference voltage source. The control circuitry may determine the frequency of the determined insulated conductor current component of the sensor current signal. In operation, the sensor signal measurement subsystem may receive an input current from the conductive sensor, and the sensor current signal may include a voltage signal indicative of the input current received from the conductive sensor. The sensor signal measurement subsystem may include an operational amplifier which operates as a current-to-voltage converter.

A method of operating a device to measure direct current (DC) voltage in an insulated conductor, the device including a housing, a conductive sensor physically coupled to the housing which is selectively positionable proximate an insulated conductor without galvanically contacting the conductor, a conductive internal ground guard which at least partially surrounds the conductive sensor and is galvanically isolated from the conductive sensor, wherein the internal ground guard is sized and dimensioned to shield the conductive sensor from stray currents, a conductive reference shield which surrounds at least a portion of the housing and is galvanically insulated from the internal ground guard, wherein the conductive reference shield is sized and dimensioned to reduce currents between the internal ground guard and an external ground, may be summarized as including mechanically oscillating the conductive sensor according to a mechanical oscillation amplitude and a mechanical oscillation frequency such that a distance between the conductive sensor and the insulated conductor varies periodically according to the mechanical oscillation amplitude and the mechanical oscillation frequency; causing a common mode reference voltage source to generate an alternating current (AC) reference voltage having a reference frequency, the common mode reference voltage source electrically coupled between the internal ground guard and the conductive reference shield; generating, by a sensor signal measurement subsystem, a sensor current signal indicative of current conducted through the conductive sensor; receiving, by control circuitry, the sensor current signal from the sensor signal measurement subsystem; and determining, by the control circuitry, the DC voltage in the insulated conductor based at least in part on the received sensor current signal.

Generating the sensor current signal may include receiving an input current from the conductive sensor; and generating a voltage signal indicative of the input current received from the conductive sensor. The sensor current signal may be generated utilizing an operational amplifier operating as a current-to-voltage converter. Mechanically oscillating the conductive sensor may include mechanically oscillating the conductive sensor using a piezoelectric effect mechanical oscillator. Mechanically oscillating the conductive sensor may include mechanically oscillating the conductive sensor using a microelectromechanical (MEMS) mechanical oscillator.

Determining the DC voltage in the insulated conductor may include converting, by at least one processor, the received sensor current signal to a digital signal; and processing, by at least one processor, the digital signal to obtain a frequency domain representation of the sensor current signal. Processing the digital signal may include implementing a fast Fourier transform (FFT) to obtain the frequency domain representation of the sensor current signal. Determining the DC voltage in the insulated conductor may include electronically filtering the received sensor current signal.

A device to measure direct current (DC) voltage in an insulated conductor may be summarized as including a conductive sensor selectively positionable proximate the insulated conductor without galvanically contacting the insulated conductor, wherein the conductive sensor capacitively couples with the insulated conductor; a mechanical oscillator operatively coupled to the conductive sensor, in operation, the mechanical oscillator causes the conductive sensor to mechanically oscillate to vary the capacitance between the conductive sensor and the insulated conductor with respect to time; a conductive internal ground guard which at least partially surrounds the conductive sensor and is galvanically isolated from the conductive sensor; a conductive reference shield which surrounds at least a portion of the housing and is galvanically insulated from the internal ground guard; a common mode reference voltage source which, in operation, generates an alternating current (AC) reference voltage having a reference frequency, the common mode reference voltage source electrically coupled between the internal ground guard and the conductive reference shield; a sensor signal measurement subsystem electrically coupled to the conductive sensor, wherein the sensor signal measurement subsystem, in operation, generates a sensor current signal indicative of current conducted through the conductive sensor; and control circuitry communicatively coupled to the sensor signal measurement subsystem, wherein, in operation, the control circuitry: receives the sensor current signal from the sensor signal measurement subsystem; and determines the DC voltage in the insulated conductor based at least in part on the received sensor current signal. In operation, the control circuitry may determine the DC voltage in the insulated conductor based on the received sensor current signal and based on the variation of the capacitance between the conductive sensor and the insulated conductor with respect to time. The mechanical oscillator may include at least one of a piezoelectric effect mechanical oscillator or a microelectromechanical (MEMS) mechanical oscillator.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

DETAILED DESCRIPTION

Figure 1A:
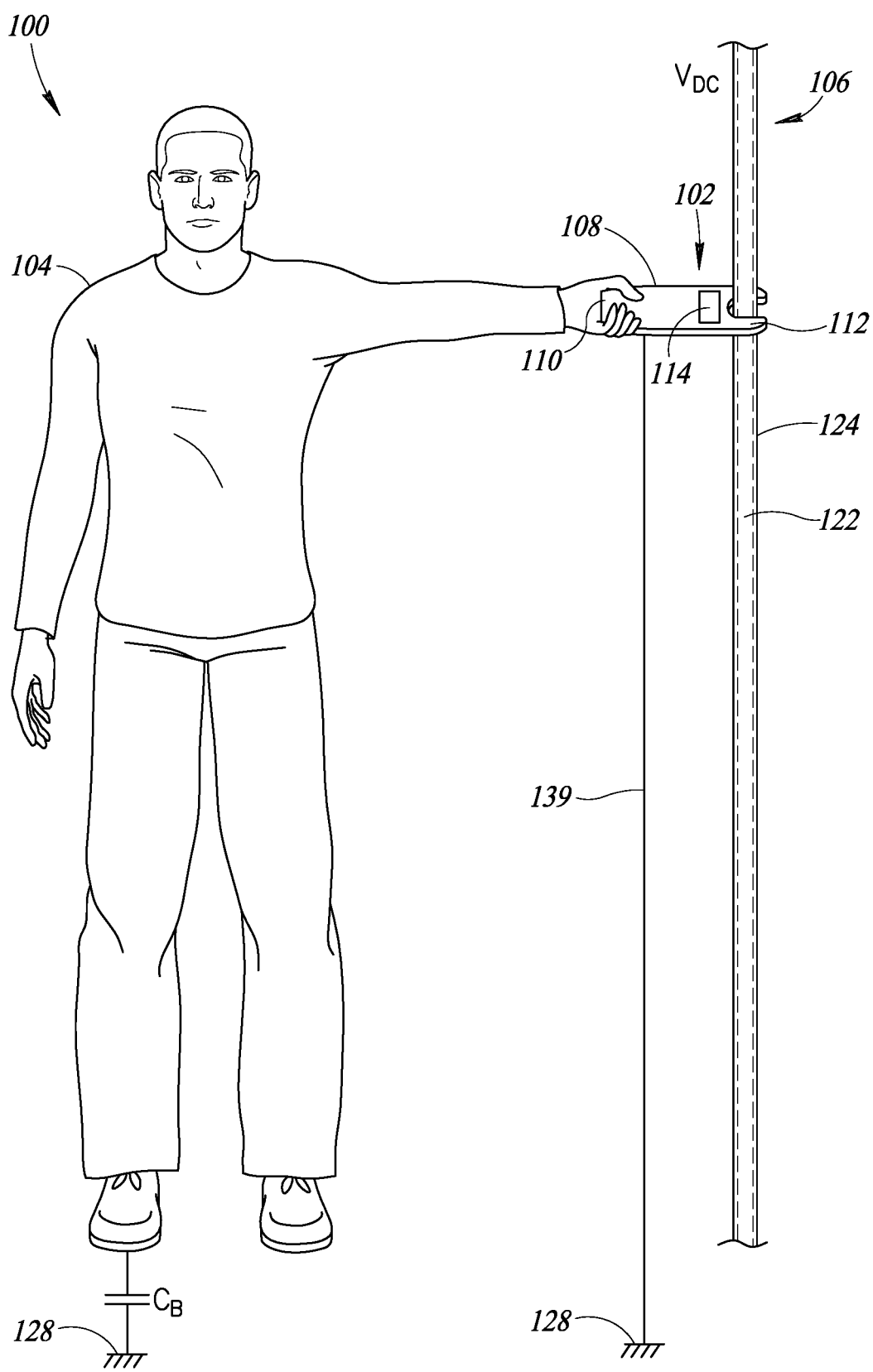
FIG. 1A is a pictorial diagram of an environment in which a non-contact DC voltage measurement device may be used by an operator to measure DC voltage present in an insulated wire without requiring galvanic contact with the wire, according to one illustrated implementation.

One or more implementations of the present disclosure are directed to systems and methods for measuring DC voltage in an insulated or blank uninsulated conductor (e.g., insulated wire) without requiring a galvanic connection between the conductor and a test electrode or probe. Generally, a non-galvanic contact (or "non-contact") voltage measurement device is provided that measures a DC voltage signal in an insulated conductor with respect to ground using a vibrating capacitive sensor. Such devices which do not require a galvanic connection are referred to herein as "non-contact." As used herein, "electrically coupled" includes both direct and indirect electrical coupling unless stated otherwise.

As an overview, a non-contact DC voltage measurement device may include a non-contact conductive sensor (e.g., a conductive membrane) that is mechanically oscillated or vibrated using a suitable oscillator (e.g., piezoelectric effect oscillator, micromechanical system (MEMS) oscillator). The conductive sensor is positionable in close proximity to the insulated conductor under test, for example, within a few millimeters of the insulated conductor. To obtain a measurement, the insulated conductor under test serves as a first conductive element or electrode of a coupling capacitor, and the vibrating conductive sensor serves as a second conductive element or electrode of the coupling capacitor. The capacitance of the resulting coupling capacitor varies with respect to time due to the vibration of the sensor, since the vibration causes the distance between the sensor and the conductor under test to be variable. The non-contact DC voltage measurement device includes circuitry for detecting or measuring the AC current flowing through the coupling capacitor as a result of the vibration, referred to herein as a signal current ($I_O$). The AC signal current is proportional to the DC voltage across the coupling capacitor and the time-varying change in the capacitance of the coupling capacitor caused by the vibration of the non-contact conductive sensor. The DC voltage measurement device uses the known reference voltage generating the reference current and the AC voltage of the vibrating non-contact sensor (e.g., 0 volts or ground), to determine the DC voltage across the coupling capacitor using the detected signal current generated by the vibration.

The determined DC voltage in the insulated conductor may be output to a user (e.g., via a display) or may be transmitted to external systems through one or more wired or wireless connections. In addition to DC voltage, the measurement devices discussed herein may also include functionality for determining other electrical parameters, such as, but not limited to, AC voltage, AC or DC current, power, phase angles, waveforms, thermal characteristics, impedance, etc.

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

Figure 1B:
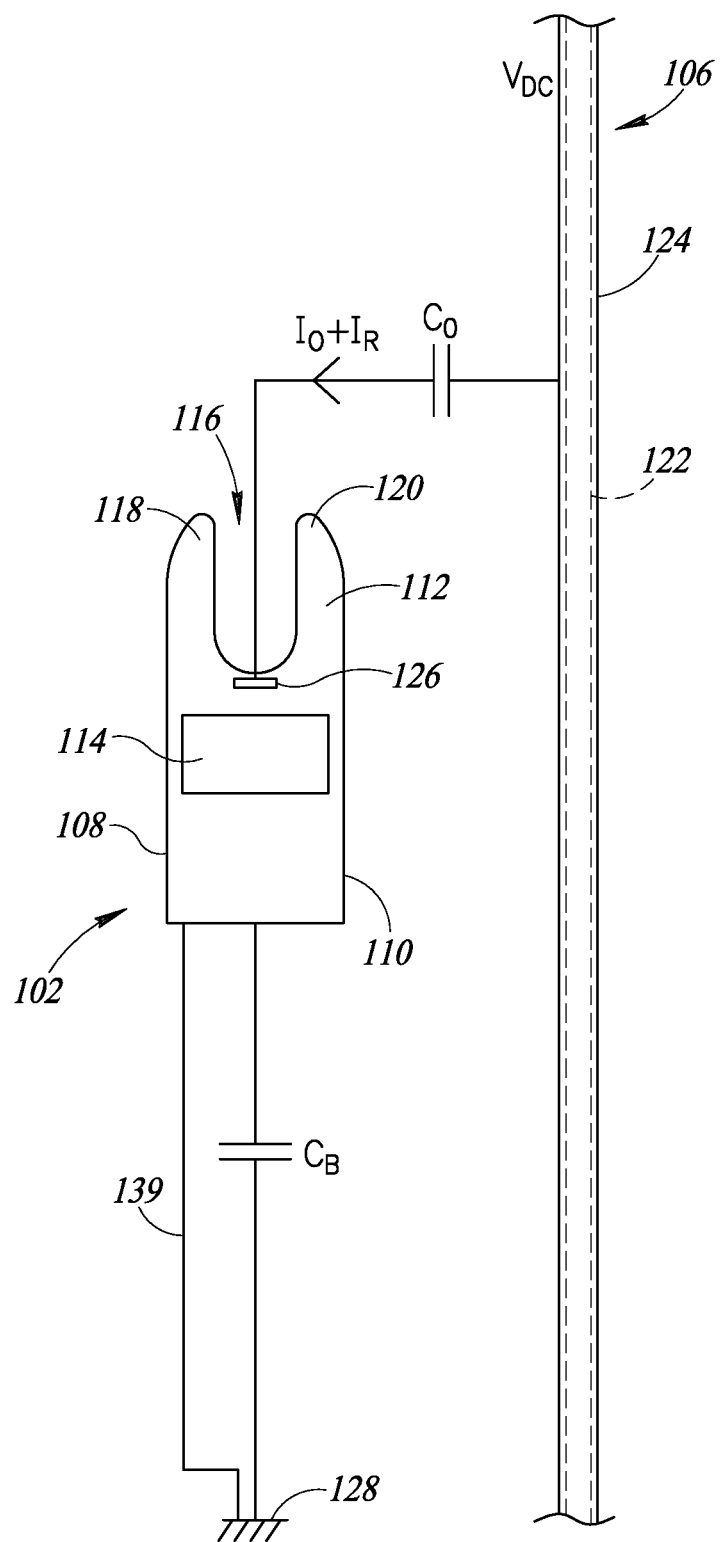
FIG. 1B is a top view of the non-contact DC voltage measurement device of FIG. 1A, showing a coupling capacitance formed between the insulated wire and a conductive sensor of the non-contact voltage measurement device, according to one illustrated implementation.

FIG. 1A is a pictorial diagram of an environment 100 in which a non-contact DC voltage measurement device 102 of the present disclosure may be used by an operator 104 to measure DC voltage present in an insulated wire 106 without requiring galvanic contact between the non-contact voltage measurement device and the wire 106. FIG. 1B is a top plan view of the non-contact voltage measurement device 102 of FIG. 1A, showing various electrical characteristics of the non-contact DC voltage measurement device during operation. The non-contact voltage measurement device 102 includes a housing or body 108 which includes a grip portion or end 110 and a probe portion or end 112, also referred to herein as a front end, opposite the grip portion. The housing 108 may also include a user interface 114 which facilitates user interaction with the non-contact voltage measurement device 102. The user interface 114 may include any number of inputs (e.g., buttons, dials, switches, touch sensor) and any number of outputs (e.g., display, LEDs, speakers, buzzers). The non-contact voltage measurement device 102 may also include one or more wired and/or wireless communications interfaces (e.g., USB, Wi-Fi®, Bluetooth®), as well as various control or processing circuitry (e.g., processor, microcontroller, DSP, ASIC, FPGA, memory).

In at least some implementations, as shown best in FIG. 1B, the probe portion 112 may include a recessed portion 116 defined by first and second extended portions 118 and 120. The recessed portion 116 receives the insulated wire 106 (see FIG. 1A). The insulated wire 106 includes a conductor 122 and an insulator 124 surrounding the conductor 122. The recessed portion 116 may include a non-contact conductive sensor or electrode 126 which rests proximate the insulator 124 of the insulated wire 106 when the insulated wire is positioned within the recessed portion 116 of the non-contact voltage measurement device 102. The sensor 126 may be positioned inside of the housing 108 or in a recessed position to prevent physical and electrical contact between the sensor and other objects. As discussed further below, in operation, the conductive sensor 126 is mechanically oscillated during a measurement process, which allows for the measurement device 102 to accurately measure the DC voltage in the insulated conductor 106 under test.

As shown in FIG. 1A, in use the operator 104 may grasp the grip portion 110 of the housing 108 and place the probe portion 112 proximate the insulated wire 106 so that the non-contact voltage measurement device 102 may accurately measure the DC voltage present in the wire with respect to earth ground (or another reference node). Although the probe end 112 is shown as having the recessed portion 116, in other implementations the probe portion 112 may be configured differently. For example, in at least some implementations the probe portion 112 may include a selectively movable clamp, a hook, a flat or arcuate surface which includes the sensor, or other type of interface which allows a sensor of the non-contact voltage measurement device 102 to be positioned proximate the insulated wire 106.

The operator's body acting as a reference to earth/ground may only be in some implementations. Alternatively a direct connection to earth 128 via a test lead 139 can be used. The non-contact measurement functionality discussed herein is not limited to applications only measuring against earth. The outside reference may be capacitively or directly coupled to any other potential. For example, if the outside reference is capacitively coupled to another phase in three phase systems, the phase-to-phase voltages are measured. In general, the concepts discussed herein are not limited to reference against earth only using a body capacitive coupling connected to a reference voltage and any other reference potential.

As discussed further below, in at least some implementations, the non-contact voltage measurement device 102 may utilize the body capacitance ($C_B$) between the operator 104 and ground 128 during the DC voltage measurement. Although the term ground is used for the node 128, the node is not necessarily earth/ground but could be connected in a galvanically isolated manner to any other reference potential by capacitive coupling. The measurement device 102 may also be coupled to a reference node, such as the node 128, by conventional galvanic coupling (e.g., a test lead).

Figure 2:
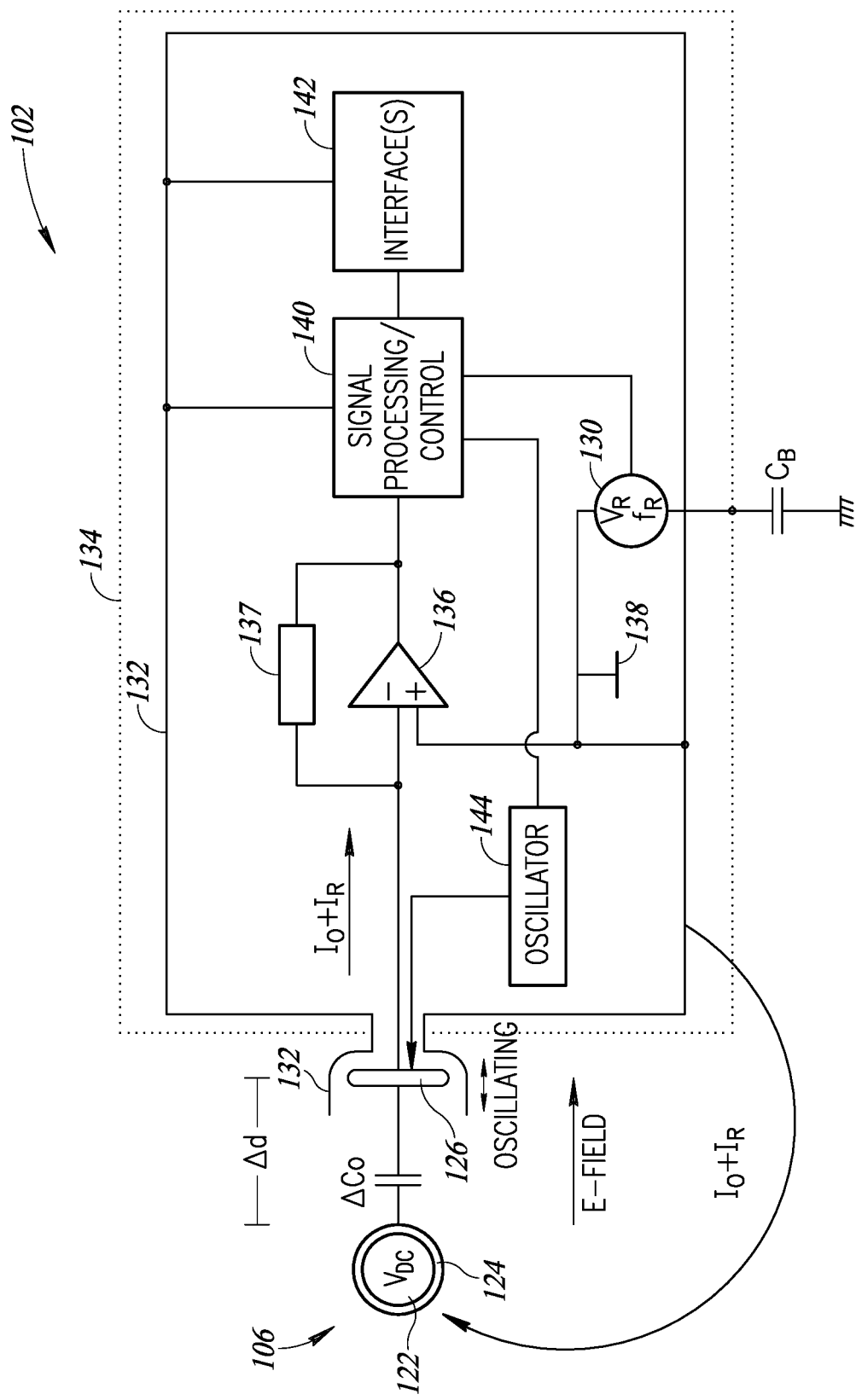
FIG. 2 is a schematic diagram of various internal components of a non-contact DC voltage measurement device, according to one illustrated implementation.

FIG. 2 shows a schematic diagram of various internal components of the non-contact voltage measurement device 102 also shown in FIGS. 1A and 1B. In this example, the conductive sensor 126 of the non-contact voltage measurement device 102 is shaped in the form of a plate or membrane and is positioned proximate the insulated wire 106 under test and capacitively couples with the conductor 122 of the insulated wire 106, forming a sensor coupling capacitor ($C_O$). It should be appreciated that the conductive sensor may be other planar shapes (e.g., circular, rectangular, triangular) or non-planar shapes (e.g., V-shaped, U-shaped). The operator 104 handling the non-contact DC voltage measurement device 102 has a body capacitance ($C_B$) to ground. Also a direct conductive ground coupling by a wire (e.g., test lead 139) can be used as shown in FIGS. 1A and 1B. As discussed further below, the insulated conductor current component or "signal current" ($I_O$) is generated over the coupling capacitor ($C_O$) and the body capacitance ($C_B$), which are connected in series, based on the DC voltage signal ($V_{DC}$) in the conductor 122 and a mechanical oscillation induced in the sensor 126. In some implementations, the body capacitance ($C_B$) may also include a galvanically isolated test lead which generates a capacitance to ground or any other reference potential.

The DC voltage ($V_{DC}$) in the wire 122 to be measured has a connection to an external ground 128 (e.g., neutral). The non-contact voltage measurement device 102 itself also has a capacitance to ground 128, which consists primarily of the body capacitance ($C_B$) when the operator 104 (FIG. 1) holds the non-contact voltage measurement device in his hand. Both capacitances $C_O$ and $C_B$ create a conductive loop and the voltage inside the loop generates the signal current ($I_O$). The signal current ($I_O$) is generated by the DC voltage signal ($V_{DC}$) capacitively coupled to the conductive sensor 126 and loops back to the external ground 128 through the housing 108 of the non-contact DC voltage measurement device and the body capacitor ($C_B$) to ground 128. The signal current ($I_O$) is dependent on the distance between the conductive sensor 126 of the non-contact voltage measurement device 102 and the insulated wire 106 under test, the particular shape of the conductive sensor 126, and the size and voltage level ($V_{DC}$) in the conductor 122.

To compensate for the distance variance and consequent coupling capacitor ($C_O$) variance which directly influences the signal current ($I_O$), the non-contact voltage measurement device 102 includes a common mode reference voltage source 130 which generates an AC reference voltage ($V_R$) which has a reference frequency ($f_R$) different from a mechanical oscillation frequency ($f_O$), discussed below.

To reduce or avoid stray currents, at least a portion of the non-contact voltage measurement device 102 may be surrounded by a conductive internal ground guard or screen 132 which causes most of the current to run through the conductive sensor 126 which forms the coupling capacitor ($C_O$) with the conductor 122 of the insulated wire 106. The internal ground guard 132 may be formed from any suitable conductive material (e.g., copper) and may be solid (e.g., foil) or have one or more openings (e.g., mesh). The guard 132 around the sensor 126 also reduces stray influences of adjacent wires close to the sensor 126 during measurement.

The non-contact voltage measurement device 102 includes a mechanical oscillator 144 that is operatively coupled to the conductive sensor 126. In operation, the mechanical oscillator 144 causes the conductive sensor 126 to mechanically oscillate according to a mechanical oscillation amplitude and a mechanical oscillation frequency ($f_O$). The mechanical oscillator 144 causes the conductive sensor 126 to oscillate in the direction of the insulated conductor 106 under test, such that a distance (d) between the conductive sensor 126 and the insulated conductor 106 varies periodically according to the mechanical oscillation amplitude and the mechanical oscillation frequency. This mechanical oscillation changes the value of the coupling capacitor ($C_O$) being exposed to the electrical field. Therefore, the signal current ($I_O$) with the oscillating frequency ($f_O$) is generated in the sensor 126. This current is proportional the electrical field. As discussed below, the common mode reference source 130 is used to inject a reference signal to the sensor with a defined known frequency ($f_R$) and magnitude ($V_R$) with a different frequency than the oscillating frequency ($f_O$) and generates a reference current $I_R$. Thus, the unknown DC voltage in the conductor 106 under test can be determined independent of the coupling capacitor $C_O$ according to formula (1), discussed below.

The mechanical oscillator 144 may be any suitable device or component that is operative to cause the conductive sensor 126 to mechanically oscillate or vibrate relative to the insulated conductor. Non-limiting examples of mechanical oscillators that may be used include a piezoelectric effect oscillator or micromechanical system (MEMS) oscillator.

To avoid currents between the internal ground guard 132 and the external ground 128, the non-contact voltage measurement device 102 includes a conductive reference shield 134. The reference shield 134 may be formed from any suitable conductive material (e.g., copper) and may be solid (e.g. sheet metal, sputtered metal inside a plastic enclosure, flexible (e.g., foil), or have one or more openings (e.g., mesh). The common mode reference voltage source 130 is electrically coupled between the reference shield 134 and the internal ground guard 132, which creates a common mode voltage or reference signal having the reference voltage ($V_R$) and the reference frequency ($f_R$) for the non-contact DC voltage measurement device 102. Such AC reference voltage ($V_R$) drives an additional reference current ($I_R$) through the coupling capacitor ($C_O$) and the body capacitor ($C_B$).

The internal ground guard 132 which surrounds at least a portion of the conductive sensor 126 protects the conductive sensor against direct influence of the AC reference voltage ($V_R$) causing an unwanted offset of reference current ($I_R$) between the conductive sensor 126 and the reference shield 134. As noted above, the internal ground guard 132 is the internal electronic ground 138 for the non-contact voltage measurement device 102. In at least some implementations, the internal ground guard 132 also surrounds some or all of the electronics of the non-contact voltage measurement device 102 to avoid the AC reference voltage ($V_R$) coupling into the electronics.

As noted above, the reference shield 134 is utilized to inject an AC reference signal onto the input AC voltage signal ($V_{AC}$) generated by the oscillation and the magnitude of the DC voltage ($V_{DC}$) and, as a second function, minimizes the guard 132 to earth ground 128 capacitance. In at least some implementations, the reference shield 134 surrounds some or all of the housing 108 of the non-contact voltage measurement device 102. In such implementations, some or all of the electronics see the reference common mode signal which also generates the reference current ($I_R$) between the conductive sensor 126 and the conductor 122 in the insulated wire 106. In at least some implementations, the only gap in the reference shield 134 may be an opening for the conductive sensor 126 which allows the conductive sensor to be positioned proximate the insulated wire 106 during operation of the non-contact voltage measurement device 102.

The internal ground guard 132 and the reference shield 134 may provide a double layer screen around the housing 108 (see FIGS. 1A and 1B) of the non-contact voltage measurement device 102. The reference shield 134 may be disposed on an outside surface of the housing 108 and the internal ground guard 132 may function as an internal shield or guard. The conductive sensor 126 is shielded by the guard 132 against the reference shield 134 such that any reference current flow is generated by the coupling capacitor ($C_O$) between the conductive sensor 126 and the conductor 122 under test. The guard 132 around the sensor 126 also reduces stray influences of adjacent wires close to the sensor.

As shown in FIG. 2, the conductive sensor 126 is positionable in close proximity to the insulated conductor 106 under test during a measurement. The conductor 122 of the insulated conductor 106 under test serves as a first conductive element or electrode of a coupling capacitor ($C_O$), and the vibrating conductive sensor 126 serves as a second conductive element or electrode of the coupling capacitor.

The non-contact voltage measurement device 102 may include a sensor signal measurement subsystem, for example, in the form of an input amplifier 136 which operates as an inverting current-to-voltage converter. The input amplifier 136 has a non-inverting terminal electrically coupled to the internal ground guard 132 which functions as the internal ground 138 of the non-contact voltage measurement device 102. An inverting terminal of the input amplifier 136 may be electrically coupled to the conductive sensor 126. Feedback circuitry 137 (e.g., feedback resistor) may also be coupled between the inverting terminal and the output terminal of the input amplifier 136 to provide feedback and appropriate gain for input signal conditioning.

The input amplifier 136 receives current that includes the signal current ($I_O$) and the reference current ($I_R$), from the conductive sensor 126 and converts the received current into a sensor current voltage signal indicative of the conductive sensor current at the output terminal of the input amplifier. The sensor current voltage signal may be an analog voltage, for example. The analog voltage may be fed to a signal processing or control module 140 which, as discussed further below, processes the sensor current voltage signal to determine the DC voltage ($V_{DC}$) in the conductor 122 of the insulated wire 106. The signal processing module 140 may include any combination of digital and/or analog circuitry, and may include an analog-to-digital converter (ADC), one or more processors, one or more nontransitory processor-readable storage media, etc.

Figure 3:
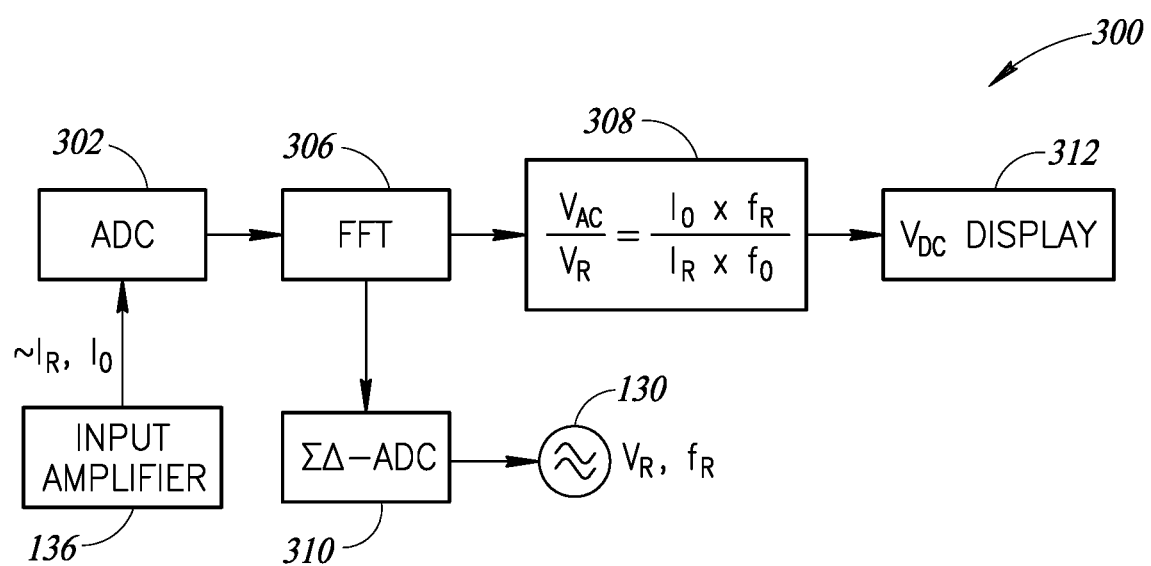
FIG. 3 is a block diagram which shows various signal processing components of a non-contact DC voltage measurement device, according to one illustrated implementation.

FIG. 3 is a block diagram of a non-contact DC voltage measurement device 300 which shows various signal processing components of the non-contact DC voltage measurement device. The non-contact DC voltage measurement device 300 may be similar or identical to the non-contact DC voltage measurement device 102 discussed above. Accordingly, similar or identical components are labeled with the same reference numerals. As shown, the input amplifier 136 converts the input current ($I_O+I_R$) from the conductive sensor 126 into a sensor current voltage signal which is indicative of the input current. The sensor current voltage signal is converted into digital form using an analog-to-digital converter (ADC) 302.

The DC voltage ($V_{DC}$) in the wire 122 is related to the AC voltage ($V_{AC}$) caused by constant vibration and the reference voltage ($V_R$). The AC voltage ($V_{AC}$) may be determined by Equation (1):

$$\frac{V_{AC}}{V_R} = \frac{I_O \times f_R}{I_R \times f_O} \quad (1)$$

where ($I_O$) is the AC signal current through the conductive sensor 126 due to the DC voltage ($V_{DC}$) in the conductor 122 and the mechanical oscillation, ($I_R$) is the reference current through the conductive sensor 126 due to the AC reference voltage ($V_R$), ($f_O$) is the oscillation frequency of the sensor 126, and ($f_R$) is the frequency of the AC reference voltage ($V_R$). The DC voltage ($V_{DC}$) in the conductor 122 can be calculated by multiplying ($V_{AC}$) from Equation (1) with a constant factor k as indicated below in Equations (1a) and (1b):

$$V_{AC} = \frac{I_O \times f_R}{I_R \times f_O} \times V_R \quad (1a)$$

$$V_{DC} = k \times V_{AC} \quad (1b)$$

This factor k is proportional the mechanical oscillating frequency and the mechanical magnitude of the oscillation. It can be determined by one measurement with a known DC voltage and the already calculated $V_{AC}$.

The signals with indices "O" or "AC" (e.g., $I_O$, $V_{AC}$) are related to the AC components caused by the oscillation with the frequency $f_O$, and signals with the indices "DC" are related to the DC voltage ($V_{DC}$) generating the electrical DC field within the coupling capacitor ($C_O$) that is vibrating. The AC parameters have different characteristics like frequencies than the signals with indices "R," which are related to the common mode reference voltage source 130. Digital processing, such as circuitry implementing a fast Fourier transform (FFT) algorithm 306, may be used to separate signal magnitudes with different frequencies. In other implementations, analog electronic filters may also be used to separate "O" signal characteristics (e.g., magnitude, frequency) from "R" signal characteristics.

The currents ($I_O$) and ($I_R$) are dependent on the frequencies ($f_O$) and ($f_R$), respectively, due to the coupling capacitor ($C_O$). The currents flowing through the coupling capacitor ($C_O$) and the body capacitance ($C_B$) are proportional to the frequency. The oscillation frequency ($f_O$) and the reference frequency ($f_R$) may be measured, or may be already known since the system generates the oscillation and the reference voltage.

After the input current ($I_O+I_R$) has been conditioned by the input amplifier 136 and digitized by the ADC 302, the frequency components of the digital sensor current voltage signal may be determined by representing the signal in the frequency domain using the FFT 306. When both of the frequencies ($f_O$) and ($f_R$) have been measured or otherwise obtained, frequency bins may be determined to calculate the fundamental magnitudes of the currents ($I_O$) and ($I_R$) from the FFT 306.

The magnitude of the current ($I_R$) and/or the current ($I_O$) may vary as a function of distance between the reference signal sensor or electrode (e.g., electrode 126) and the conductor 122 of the insulated wire 106. Thus, the system may compare the measured current ($I_R$) and/or the current ($I_O$) to expected respective currents to determine the distance between the reference signal sensor or electrode and the conductor 122.

Next, as indicated by a block 308 of FIG. 3, the ratio of the fundamental harmonics of the currents ($I_R$) and ($I_O$) may be corrected by the determined or obtained frequencies ($f_O$) and ($f_R$), and this factor may be used to calculate the DC voltage ($V_{DC}$) in the wire 122.

The coupling capacitor ($C_O$) may generally have a capacitance value in the range of approximately 0.02 pF to 1 pF, for example, depending on the distance between the insulated conductor 106 and the conductive sensor 126, as well as the particular shape and dimensions of the sensor 126. The body capacitance ($C_B$) may have a capacitance value of approximately 20 pF to 200 pF, for example.

From formula (1) above, it can be seen that the AC reference voltage ($V_R$) generated by the common mode reference voltage source 130 does not need to be in the same range as the AC voltage ($V_{AC}$) generated by the vibration in the conductor 122 to achieve similar current magnitudes for the signal current ($I_O$) and the reference current ($I_R$). The AC reference voltage ($V_R$) may be relatively low (e.g., less than 5 V) by selecting the reference frequency ($f_R$) to be relatively high.

Any suitable signal generator may be used to generate the AC reference voltage ($V_R$) having the reference frequency ($f_R$). In the example illustrated in FIG. 3, a Sigma-Delta digital-to-analog converter (Σ-Δ DAC) 310 is used. The Σ-Δ DAC 310 uses a bit stream to create a waveform (e.g., sinusoidal waveform) signal with the defined reference frequency ($f_R$) and AC reference voltage ($V_R$). In at least some implementations, the Σ-Δ DAC 310 may generate a waveform that is in phase with the window of the FFT 306 to reduce jitter. Any other reference voltage generator can be used, such as a PWM which may use less computing power than a Σ-Δ DAC.

The sensor current ($I_O$) that flows through the coupling capacitor ($C_O$) is proportional to the voltage across the coupling capacitor ($V_{DC}$) and the time-varying change in the capacitance (ΔC/Δt) of the coupling capacitor caused by the vibration of the non-contact conductive sensor 126. This relationship can be expressed by formula (2) below:

$$I_O = k_1 \times V_{DC} \times \frac{dC}{dt} \quad (2)$$

where $k_1$ is a constant of proportionality. The constant $k_1$ may be dependent on at least one of: a physical characteristic of the conductive sensor 126, a physical characteristic of the insulated conductor 106 under test, or a physical characteristic of a space between the conductive sensor and the insulated conductor during measurement. For example, the constant $k_1$ may be dependent on the particular shape of the conductive sensor 126, the area of the conductive sensor, the permittivity of the volume between the conductive sensor and the insulated conductor under test, etc.

Rearranging formula (2) above, the DC voltage ($V_{DC}$) may be determined as follows:

$$V_{DC} = k_2 \times \frac{I_O}{\Delta C/\Delta t} \quad (3)$$

where $k_2$ is a constant of proportionality equal to $1/k_1$. The time-varying capacitance (ΔC/Δt) is dependent on the mechanical oscillation amplitude, which determines the periodic change in the separation distance (d) between the conductive sensor 126 and the insulated conductor 106 as the conductive sensor 126 vibrates. The time-varying capacitance (ΔC/Δt) is also dependent on the mechanical oscillation frequency ($f_O$) of the conductive sensor 126.

As a simplified example, the conductive sensor 126 and the conductor 106 under test may be modeled as a parallel plate capacitor ($C_O$) during measurement. A parallel plate capacitor has a capacitance (C) defined by formula (4) below:

$$C = \frac{Q}{V} = \frac{\varepsilon A}{d} \quad (4)$$

where Q is the charge on the parallel plates, V is the voltage across the capacitor, (c) is the permittivity of the capacitor, (A) is the area of the parallel plates, and (d) is the distance between the two plates. Further, the current ($I_O$) flowing in the capacitor may be defined by formula (5) below:

$$I_O = \frac{\Delta Q}{\Delta t} \quad (5)$$

Using formulas (4) and (5) above, the current in the capacitor may be defined by formula (6) below:

$$I_O = \varepsilon \times A \times V \times \frac{\Delta\left(\frac{1}{d}\right)}{\Delta t} \quad (6)$$

Formula (5) can then be rearranged to determine the voltage (V) across the capacitor as a function of the signal current, the mechanical oscillation amplitude and the mechanical oscillation frequency. If the distance (d) between conductor and sensor is known, then equation (6) can be solved. However, the distance (d) may not be known and thus the reference signal may be needed to solve the equation independent of the coupling capacitance ($C_O$) as it has been presented above in equations (1), (1a) and (1b).

In practice, the measurement device 102 may use one or more mathematical formulas, lookup tables, and/or calibration factors to determine the DC voltage ($V_{DC}$) in the insulated conductor 106 based on the detected signal current ($I_O$). As discussed above, in at least some implementations, the measurement device 102 may be operative to measure one or more other electrical parameters, such as current, power, phase angles, etc.

The non-contact voltage measurement device 102 may also include one or more interfaces 142 communicatively coupled to the signal processing module 140. The one or more interfaces 142 may include one or more input or output components of a user interface, such as one or more displays, speakers, touch pads, touch screens, buttons, dials, knobs, wheels, etc. The one or more interfaces 142 may additionally or alternatively include one or more wired or wireless communications interfaces, such as a USB interface, a Bluetooth® interface, a Wi-Fi® interface, etc. The various interfaces 142 may allow for interaction with the non-contact voltage measurement device 102, such as outputting the determined DC voltage ($V_{DC}$) or communicating information to the operator 104 of the non-contact voltage measurement device. The one or more communications interfaces may be used to transmit data (e.g., measurement data) to external systems, or to receive data (e.g., control instructions) from external systems.

Figure 4:
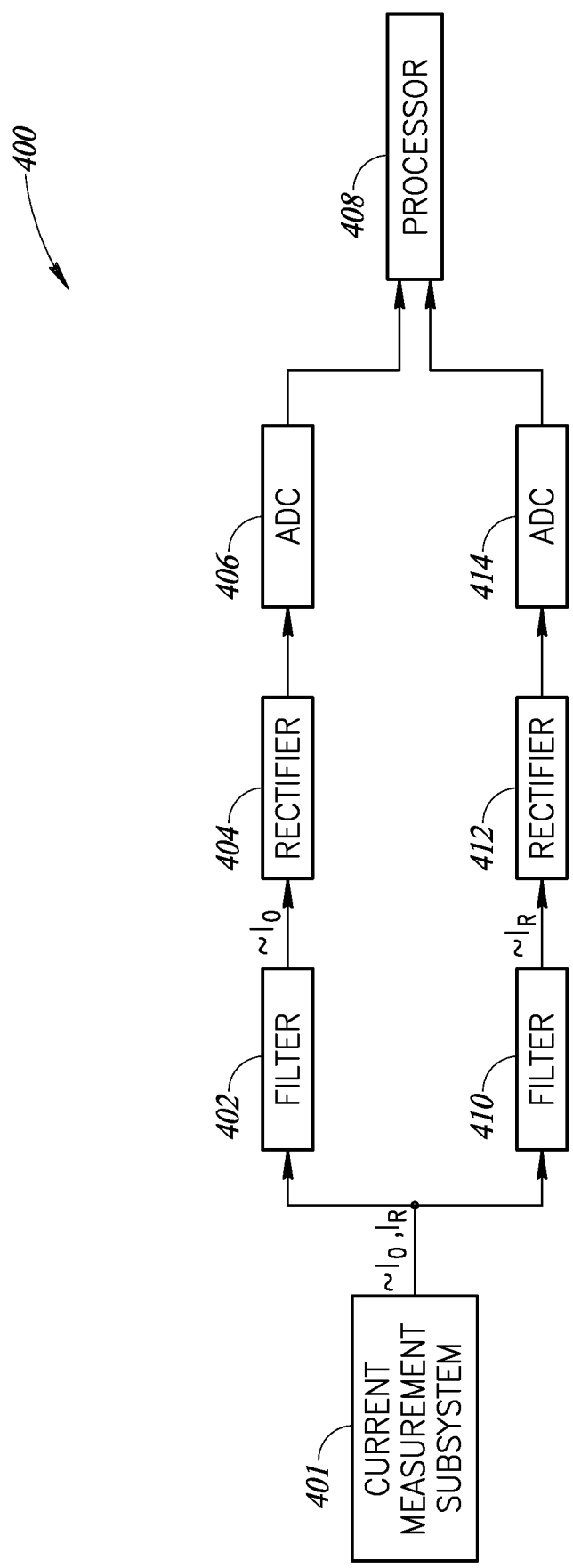
FIG. 4 is a block diagram of a non-contact DC voltage measurement device which implements analog electronic filters, according to an example for signal and reference signal separation.

FIG. 4 is a block diagram of a signal processing portion 400 of a non-contact voltage measurement system which implements electronic filters. The signal processing portion 400 may receive a sensor current voltage signal that is proportional to the conductive sensor 126 current ($I_O+I_R$) from a current measurement subsystem 401 (e.g., input amplifier 136).

As discussed above, the signal current ($I_O$) has a different frequency than the reference current ($I_R$). To isolate the signal current ($I_O$) from the reference current ($I_R$), the signal processing portion 400 may include a first filter 402 which operates to pass the signal current ($I_O$) and reject the reference current ($I_R$). The filtered signal may then be rectified by a first rectifier 404 and digitized by a first ADC 406. The digitized signal may be fed to a suitable processor 408 for use in calculations, as discussed above. Similarly, to isolate the reference current ($I_R$) from the signal current ($I_O$), the signal processing portion 400 may include a second filter 410 which operates to pass the reference current ($I_R$) and reject the signal current ($I_O$). The filtered signal may then be rectified by a second rectifier 412 and digitized by a second ADC 414. The digitized signal may be fed to a suitable processor 408 for use in calculations. The first and second filters 402 and 410 may be any suitable analog filters, and may each include a number of discrete components (e.g., capacitors, inductors).

The foregoing detailed description has set forth various implementations of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one implementation, the present subject matter may be implemented via Application Specific Integrated Circuits (ASICs). However, those skilled in the art will recognize that the implementations disclosed herein, in whole or in part, can be equivalently implemented in standard integrated circuits, as one or more computer programs running on one or more computers (e.g., as one or more programs running on one or more computer systems), as one or more programs running on one or more controllers (e.g., microcontrollers) as one or more programs running on one or more processors (e.g., microprocessors), as firmware, or as virtually any combination thereof, and that designing the circuitry and/or writing the code for the software and or firmware would be well within the skill of one of ordinary skill in the art in light of this disclosure.

Those of skill in the art will recognize that many of the methods or algorithms set out herein may employ additional acts, may omit some acts, and/or may execute acts in a different order than specified. As an example, in at least some implementations a non-contact voltage measurement system may not utilize a processor to execute instructions. For example, a non-contact voltage measurement device may be hardwired to provide some or all of the functionality discussed herein. Additionally, in at least some implementations a non-contact voltage measurement device may not utilize a processor to cause or initiate the different measurements discussed herein. For example, such non-contact voltage measurement device may rely on one or more separate inputs, such as a user-actuated button which causes measurements to occur.

In addition, those skilled in the art will appreciate that the mechanisms taught herein are capable of being distributed as a program product in a variety of forms, and that an illustrative implementation applies equally regardless of the particular type of signal bearing media used to actually carry out the distribution. Examples of signal bearing media include, but are not limited to, the following: recordable type media such as floppy disks, hard disk drives, CD ROMs, digital tape, and computer memory.

The various implementations described above can be combined to provide further implementations. These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A device to measure direct current (DC) voltage in an insulated conductor, the device comprising:
    a conductive sensor selectively positionable proximate the insulated conductor without galvanically contacting the insulated conductor;
    a conductive internal ground guard that is galvanically isolated from the conductive sensor;
    a conductive reference shield that is galvanically insulated from the internal ground guard;
    a mechanical oscillator operatively coupled to the conductive sensor, wherein the mechanical oscillator, in operation, causes the conductive sensor to mechanically oscillate such that a distance between the conductive sensor and the insulated conductor varies according to the mechanical oscillation;
    a common mode reference voltage source which, in operation, generates an alternating current (AC) reference voltage, the common mode reference voltage source electrically coupled between the internal ground guard and the conductive reference shield;
    a sensor signal measurement subsystem electrically coupled to the conductive sensor, wherein the sensor signal measurement subsystem, in operation, generates a sensor current signal indicative of current conducted through the conductive sensor; and
    control circuitry communicatively coupled to the sensor signal measurement subsystem, wherein, in operation, the control circuitry:
        receives the sensor current signal from the sensor signal measurement subsystem; and
        determines the DC voltage in the insulated conductor based at least in part on the sensor current signal.

2. The device of claim 1, wherein the control circuitry determines the DC voltage in the insulated conductor based at least in part on the sensor current signal, a mechanical oscillation frequency of the mechanical oscillator, the AC reference voltage, and a reference frequency of the AC reference voltage.

3. The device of claim 1, wherein the mechanical oscillator comprises a piezoelectric effect mechanical oscillator.

4. The device of claim 1, wherein the mechanical oscillator comprises a microelectromechanical (MEMS) mechanical oscillator.

5. The device of claim 1, wherein the control circuitry, in operation:
converts the sensor current signal to a digital signal; and
processes the digital signal to obtain a frequency domain representation of the sensor current signal.

6. The device of claim 5, wherein the control circuitry implements a fast Fourier transform (FFT) to obtain the frequency domain representation of the sensor current signal.

7. The device of claim 6, wherein the common mode reference voltage source generates the AC reference voltage in phase with a window of the FFT implemented by the control circuitry.

8. The device of claim 1, wherein the control circuitry comprises at least one electronic filter which filters the sensor current signal.

9. The device of claim 1, wherein the control circuitry processes the sensor current signal to determine an insulated conductor current component and a reference current component, the insulated conductor current component indicative of the current conducted through the conductive sensor due to the voltage in the insulated conductor, and the reference current component indicative of the current conducted through the conductive sensor due to the voltage of the common mode reference voltage source.

10. The device of claim 9, wherein the control circuitry determines a frequency of the insulated conductor current component of the sensor current signal.

11. The device of claim 1, wherein, in operation, the sensor signal measurement subsystem receives an input current from the conductive sensor, and the sensor current signal comprises a voltage signal indicative of the input current received from the conductive sensor.

12. The device of claim 1, wherein the sensor signal measurement subsystem comprises an operational amplifier which operates as a current-to-voltage converter.

13. A method of operating a device to measure direct current (DC) voltage in an insulated conductor, the device comprising a conductive sensor selectively positionable proximate an insulated conductor without galvanically contacting the insulated conductor, a conductive internal ground guard which at least partially surrounds the conductive sensor and is galvanically isolated from the conductive sensor, and a conductive reference shield that is galvanically insulated from the internal ground guard, the method comprising:
mechanically oscillating the conductive sensor such that a distance between the conductive sensor and the insulated conductor varies according to the mechanical oscillation;
causing a common mode reference voltage source to generate an alternating current (AC) reference voltage, the common mode reference voltage source electrically coupled between the internal ground guard and the conductive reference shield;
generating, by a sensor signal measurement subsystem, a sensor current signal indicative of current conducted through the conductive sensor;
receiving, by control circuitry, the sensor current signal from the sensor signal measurement subsystem; and
determining, by the control circuitry, the DC voltage in the insulated conductor based at least in part on the sensor current signal.

14. The method of claim 13, wherein generating the sensor current signal comprises:
receiving an input current from the conductive sensor; and
generating a voltage signal indicative of the input current received from the conductive sensor.

15. The method of claim 13, wherein the sensor current signal is generated utilizing an operational amplifier operating as a current-to-voltage converter.

16. The method of claim 13, wherein mechanically oscillating the conductive sensor comprises mechanically oscillating the conductive sensor using a piezoelectric effect mechanical oscillator.

17. The method of claim 13, wherein mechanically oscillating the conductive sensor comprises mechanically oscillating the conductive sensor using a microelectromechanical (MEMS) mechanical oscillator.

18. The method of claim 13, wherein determining the DC voltage in the insulated conductor comprises:
converting, by at least one processor, the sensor current signal to a digital signal; and
processing, by the at least one processor, the digital signal to obtain a frequency domain representation of the sensor current signal.

19. The method of claim 18, wherein processing the digital signal comprises implementing a fast Fourier transform (FFT) to obtain the frequency domain representation of the sensor current signal.

20. The method of claim 13, wherein determining the DC voltage in the insulated conductor comprises electronically filtering the sensor current signal.

21. A device to measure direct current (DC) voltage in an insulated conductor, the device comprising:
a conductive sensor selectively positionable proximate the insulated conductor without galvanically contacting the insulated conductor;
a mechanical oscillator operatively coupled to the conductive sensor, wherein the mechanical oscillator, in operation, causes the conductive sensor to mechanically oscillate to vary a capacitance between the conductive sensor and the insulated conductor with respect to time;
a conductive internal ground guard that is galvanically isolated from the conductive sensor;
a conductive reference shield that is galvanically insulated from the internal ground guard;
a common mode reference voltage source which, in operation, generates an alternating current (AC) reference voltage, the common mode reference voltage source electrically coupled between the internal ground guard and the conductive reference shield;
a sensor signal measurement subsystem electrically coupled to the conductive sensor, wherein the sensor signal measurement subsystem, in operation, generates a sensor current signal indicative of current conducted through the conductive sensor; and
control circuitry communicatively coupled to the sensor signal measurement subsystem, wherein, in operation, the control circuitry:
receives the sensor current signal from the sensor signal measurement subsystem; and
determines the DC voltage in the insulated conductor based at least in part on the sensor current signal.

22. The device of claim 21, wherein, in operation, the control circuitry determines the DC voltage in the insulated conductor based on the sensor current signal and based on a variation of the capacitance between the conductive sensor and the insulated conductor with respect to time.

23. The device of claim 21, wherein the mechanical oscillator comprises at least one of a piezoelectric effect mechanical oscillator or a microelectromechanical (MEMS) mechanical oscillator.

* * * * *